United States Patent
Song (10) Patent No.: US 7,271,673 B2
(45) Date of Patent: Sep. 18, 2007

(54) VOLTAGE CONTROLLED OSCILLATOR (VCO) TUNING

(75) Inventor: Hongjiang Song, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 82 days.

(21) Appl. No.: 11/171,860

(22) Filed: Jun. 30, 2005

(65) Prior Publication Data

US 2007/0001775 A1    Jan. 4, 2007

(51) Int. Cl.
*H03B 5/08* (2006.01)
(52) U.S. Cl. ............... 331/167; 331/36 C; 331/117 R; 331/117 FE; 331/177 V
(58) Field of Classification Search ............... 331/167, 331/36 C, 117 R, 117 FE, 177 V
See application file for complete search history.

(56) References Cited

U.S. PATENT DOCUMENTS

| 6,226,506 | B1 * | 5/2001 | Welland et al. ............. 455/260 |
| 6,803,829 | B2 * | 10/2004 | Duncan et al. ............... 331/34 |
| 6,927,637 | B1 * | 8/2005 | Koh et al. .................... 331/17 |
| 6,975,156 | B2 * | 12/2005 | Yeh ............................. 327/337 |
| 7,002,393 | B2 * | 2/2006 | Yeh ............................. 327/337 |
| 7,019,598 | B2 * | 3/2006 | Duncan et al. ............. 331/176 |

* cited by examiner

*Primary Examiner*—Robert Pascal
*Assistant Examiner*—Levi Gannon
(74) *Attorney, Agent, or Firm*—Lee & Hayes, PLLC (57) ABSTRACT

In accordance with certain described implementations, a voltage controlled oscillator (VCO) includes a VCO coarse tuning bank having multiple coarse tuning bank bits. Each coarse tuning bank bit has an associated bit capacitance. The bit capacitances of the coarse tuning bank bits may be selectively engaged using, for example, a single switching transistor for each coarse tuning bank bit.

22 Claims, 9 Drawing Sheets

VOLTAGE CONTROLLED OSCILLATOR (VCO) TUNING

BACKGROUND

Many electronic products today operate in accordance with a preset frequency or range of frequencies. To operate in accordance with a given frequency, an electronic device usually generates the given frequency internally. This generated frequency effectively regulates their operation. For example, a processor's clock speed, a transceiver's radio range, a phase locked loop's (PLL's) control setting, etc. are each related to a given frequency that regulates their operation. Hence, most electronic devices, as well as the integrated circuits (ICs) that are utilized therein, perform better with superior frequency generators.

There are multiple approaches to generating a frequency within a device. One such approach is the voltage controlled oscillator (VCO). A voltage that is input to the VCO sets a frequency that is output by the VCO. In other words, adjusting the input voltage adjusts the output frequency. An example VCO type is the inductive-capacitance (LC) VCO. An LC-VCO produces a voltage oscillation at a given frequency using the inverse frequency-related properties of inductors and capacitors.

Circuits having VCOs utilize some scheme and/or technique to tune the VCO to a desired frequency. LC-VCOs in particular may be tuned, at least in part, using tuning banks. LC-VCOs with better tuning banks can therefore operate more precisely and/or with an overall higher quality. Consequently, computers, mobile phones, radio units, high-speed interfaces, etc. can benefit from an LC-VCO with a well-designed tuning bank.

BRIEF DESCRIPTION OF THE DRAWINGS

The same numbers are used throughout the document to reference like components and/or features.

DETAILED DESCRIPTION

Figure 1:
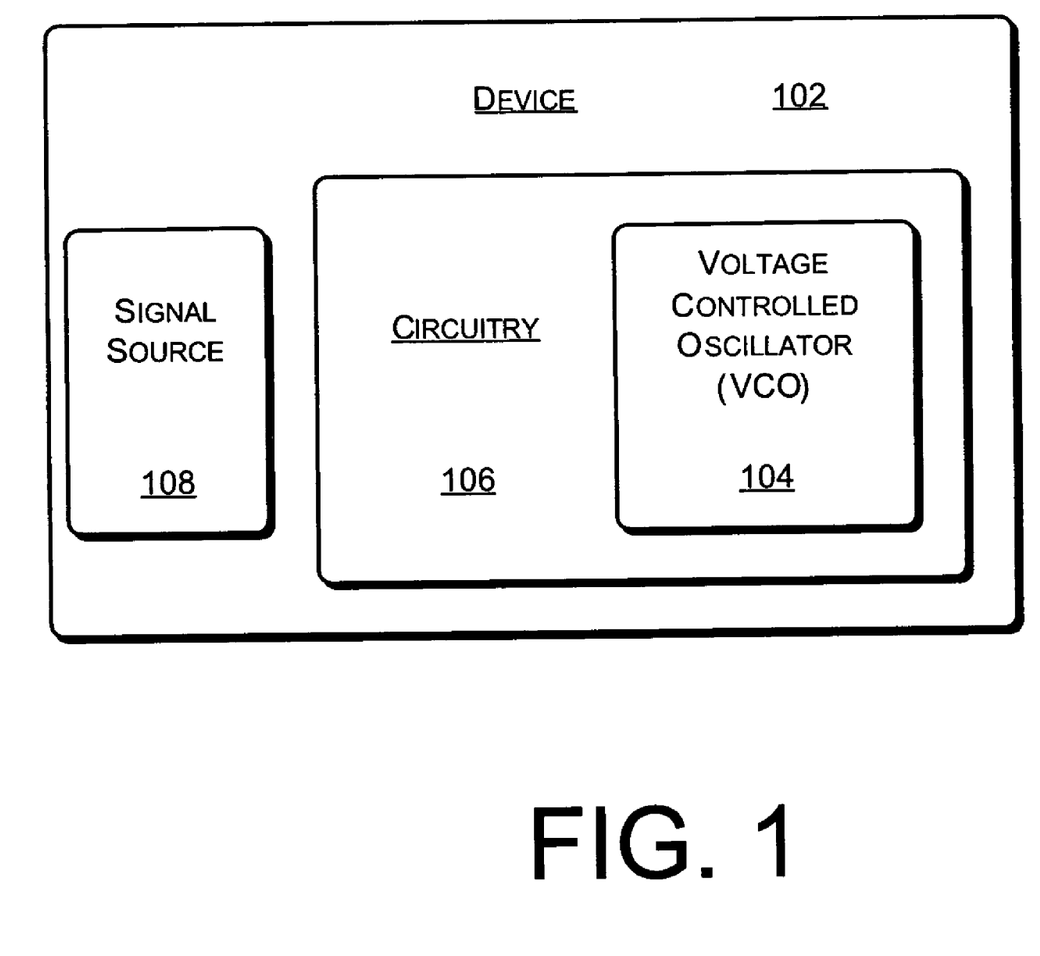
FIG. 1 is a block diagram of an example device that includes a voltage controlled oscillator (VCO).

FIG. 1 is a block diagram of an example device 102 that includes a voltage controlled oscillator (VCO) 104. In a described implementation, VCO 104 is adapted to generate a predetermined, but selectable, output frequency in response to an input voltage. The output frequency is provided to circuitry 106, and thus to device 102, from a signal source 108. Circuitry 106 can utilize the frequency for any of many possible purposes. Example purposes and environments are described further below.

As illustrated, device 102 includes circuitry 106 that comprises a VCO 104. Device 102 may be a complete electronic product, a printed circuit board (PCB), an integrated circuit (IC), and so forth. Circuitry 106 may be realized as a PCB, an IC, a circuit, and so forth. VCO 104 may be realized as, for example, an IC, a circuit, a set of discrete components, some combination thereof, and so forth.

VCOs are included in, for example, wireless communication products, high performance central processing units (CPUs), computer servers, high-speed input/output (I/O) applications, and so forth. More generally, a VCO may be employed in any relatively high-speed IC and/or in an IC that can benefit from a high quality frequency signal. By way of example only, (i) device 102 may be a computer while circuitry 106 comprises a microprocessor, (ii) device 102 may be a memory subsystem while circuitry 106 comprises a memory interface card, (iii) device 102 may be a wireless adapter unit while circuitry 106 comprise a radio IC, (iv) device 102 may be a wireless phone while circuitry 106 comprises a transmitter and/or a receiver (e.g., a transceiver), and so forth.

Figure 2:
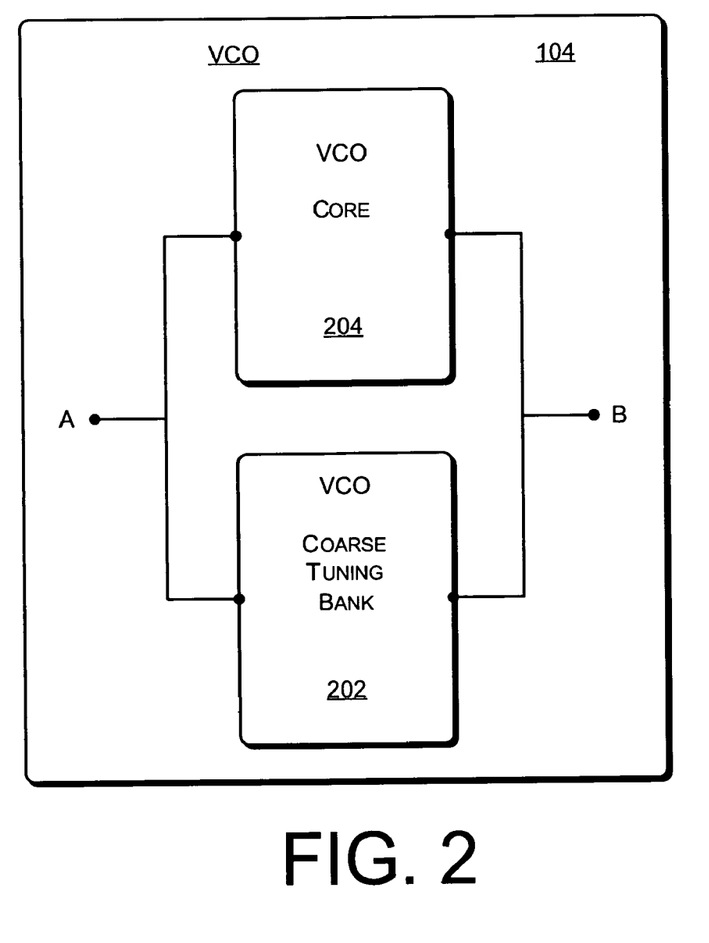
FIG. 2 is a block diagram of an example VCO that includes a VCO coarse tuning bank and a VCO core.

FIG. 2 is a block diagram of an example VCO 104 that includes a VCO coarse tuning bank 202 and a VCO core 204. As illustrated, VCO core 204 and VCO coarse tuning bank 202 are connected at node A and node B. In a described implementation, VCO core 204 includes core VCO components such as the inductor(s), the base capacitors, and so forth. VCO core 204 may also include a VCO fine tuning apparatus to enable a fine tuning of the output frequency. An example VCO core 204 is described further below with particular reference to FIG. 3.

VCO coarse tuning bank 202 comprises a bank of capacitors that enable a coarse tuning of the output frequency. By way of example only, the coarse tuning of VCO coarse tuning bank 202 typically focuses the frequency to within 2-5% of the target output frequency, and the fine tuning of a fine tuning apparatus (not explicitly illustrated in FIG. 2) further focuses the output frequency toward the target output frequency to a given level of precision. An example of an existing scheme for a VCO coarse tuning bank is described further below with particular reference to FIGS. 4 and 5. Examples of additional schemes and techniques for VCO coarse tuning bank 202 are described further below with particular reference to FIGS. 6-9.

Figure 3:
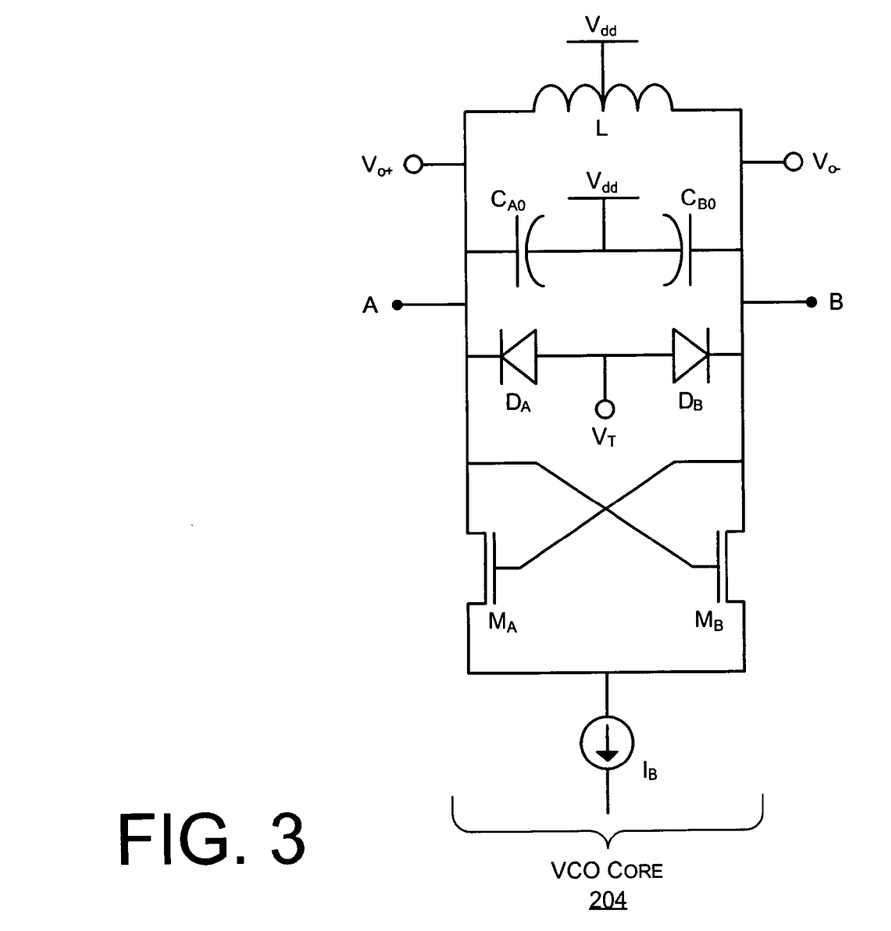
FIG. 3 is a circuit diagram of an example VCO core.

FIG. 3 is a circuit diagram of an example VCO core 204. As illustrated, VCO core 204 includes a base LC tank, a fine tuning apparatus, two transistors, and a current source. VCO core 204 also includes the frequency output nodes, nodes $V_{o+}$ and $V_{o-}$, which are also the VCO coarse tuning bank coupling nodes, nodes A and B, in FIG. 3. The specific circuit diagram shown in FIG. 3 is described herein by way of example only. Thus, VCO core 204 may be configured in alternative manners.

FIG. 3 illustrates and the description herein explicitly refers to capacitors, inductors, and so forth. However, capacitors may be realized using, for example, the capacitive effects of a transistor. Similarly, inductors may be realized using, for example, the inductive effects of binding wire. Thus, although a given component may be referred to herein as a capacitor or an inductor, it may actually be implemented using a transistor or a binding wire, respectively, that is configured to be a capacitor or an inductor.

An inductor L (with a central supply voltage tap) or two inductors L form the inductor of the LC tank of the LC-VCO. The inductor L receives the supply voltage $V_{dd}$. The inductor L extends between the frequency output nodes $V_{o+}$ and $V_{o-}$. The base or fixed capacitors $C_{A0}$ and $C_{B0}$ are connected in series and are coupled to output nodes $V_{o+}$ and $V_{o-}$, respectively. A common node between the fixed capacitors $C_{A0}$ and $C_{B0}$ receives the supply voltage $V_{dd}$. As is apparent from FIG. 3, the VCO coarse tuning bank coupling nodes A and B are the same as the output nodes $V_{o+}$ and $V_{o-}$, respectively.

Two diode varactors $D_A$ and $D_B$ are connected in series and are also coupled to output nodes $V_{o+}$ and $V_{o-}$, respectively. Hence, diodes $D_A$ and $D_B$ are connected in parallel with the fixed capacitors $C_{A0}$ and $C_{B0}$. A common node between the diodes $D_A$ and $D_B$ receives the fine tuning input signal $V_T$. Thus, fine tuning input $V_T$ and diodes $D_A$ and $D_B$ comprise the fine tuning apparatus of VCO core 204.

Two transistors $M_A$ and $M_B$ are arranged in a differential relationship. The drain-source channels are connected in series between VCO coarse tuning bank coupling nodes A and B and a common node that is coupled to a current source $I_B$. The value of the current $I_B$ may be set initially so as to establish an operating point. The gates of the transistors $M_A$ and $M_B$ are cross-coupled to opposite nodes. More specifically, the gate of transistor $M_A$ is coupled to node B, and the gate of transistor $M_B$ is coupled to node A.

With an N-channel metal oxide semiconductor (NMOS) process technology for transistors $M_A$ and $M_B$, the sources correspond to the common node of the current source $I_B$, and the drains correspond to nodes A and B, respectively. Also, the current source $I_B$ produces a current bias away from the transistors $M_A$ and $M_B$. Although the example diagrams utilize NMOS technology for the transistor components, the described schemes and techniques are process-independent. For example, transistors may alternatively be P-channel MOS (PMOS) technology, bi-polar junction transistor (BJT) technology, and so forth.

The example VCO core 204 of FIG. 3 for an LC-type VCO 104 is typical of a very large scale integrated (VLSI) VCO circuit. The total effective capacitance and the inductance of the VCO between nodes A and B jointly set the oscillation frequency range of the VCO. In addition to the base capacitors, the total effective capacitance of the VCO is impacted by the capacitance that is present within an associated VCO coarse tuning bank and that is activated by a coarse tuning value so as to affect the fixed capacitance of VCO core 204. Examples of the capacitive contributions of VCO coarse tuning banks are described further below.

Because the inductance L is fixed for most LC-VCOs, the maximum capacitance $C_{max}$ and the minimum capacitance $C_{min}$ establish the tuning range of the VCO, as indicated by equation (1):

$$\frac{1}{\sqrt{LC_{max}}} \le f \le \frac{1}{\sqrt{LC_{min}}}. \quad (1)$$

A factor for achieving a wider tuning range for a VCO is the maximization of the ratio of the largest and the smallest tank capacitance that may be effectuated under tuning. In practice, the selection of the largest capacitance is often limited by a desired minimal operational frequency of the VCO. The tuning range of the varactors $D_A$ and $D_B$ is limited by the process technology. Consequently, increasing the ratio of the effective capacitance between the ON state and the OFF state of each coarse tuning bit in the coarse tuning bank of capacitors can increase the ultimate tuning range for a given process technology.

Figure 4:
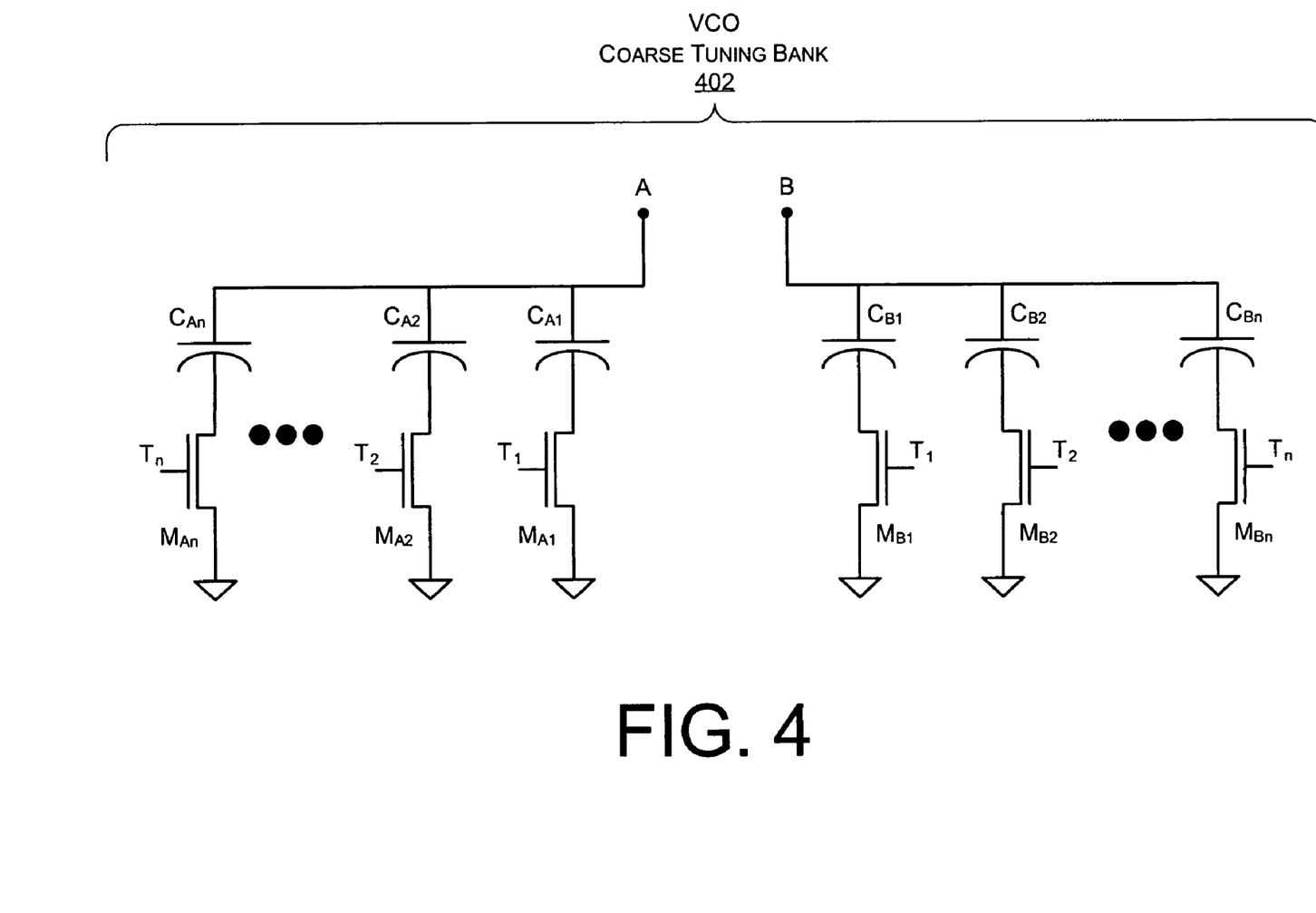
FIG. 4 is a circuit diagram of an example VCO coarse tuning bank in accordance with an existing scheme.

FIG. 4 is a circuit diagram of an example VCO coarse tuning bank 402 in accordance with an existing scheme. VCO coarse tuning bank 402 is separable into two parts. A first part couples to a VCO core 204 at node A, and a second part couples to VCO core 204 at node B. Each part includes "n" coarse tuning bits, with n=1, 2 . . . n, where n is an integer. Typical values for n are 8, 16, 32, etc., but other values may alternatively be used.

Generally, each coarse tuning bit includes a capacitor C that is connected in series with a transistor M. Each capacitor C is also coupled to a VCO coarse tuning bank coupling node, and each transistor M is also coupled to a ground potential (or, more generally, a common potential). For an NMOS implementation, by way of example only, the drain of each transistor M is located between transistor M and capacitor C, and the source of each transistor M is located between transistor M and ground.

The gate of each transistor M receives a control signal T that enables transistor M to function as a switch. Thus, the control signal causes transistor M to open or close. With NMOS, a high value for T opens the transistor switch, and a low value for T closes the transistor switch. When a transistor M switch is closed, the corresponding coarse tuning bit is active, and the associated capacitor C that is in series therewith impacts the overall effective capacitance of the LC tank. Conversely, when a transistor M switch is open, the corresponding coarse tuning bit is inactive, and the associated capacitor C that is in series therewith does not impact the overall effective capacitance of the LC tank.

More specifically, as illustrated in FIG. 4, VCO coarse tuning bank 402 includes "n" pairs of capacitors $C_{A/B}$. The "A" part includes n capacitors $C_{A1}, C_{A2} \ldots C_{An}$. The "B" part includes n capacitors $C_{B1}, C_{B2} \ldots C_{Bn}$. Thus, associated capacitors $C_{A1}$ and $C_{B1}$ form a capacitor pair $C_1$, associated capacitors $C_{A2}$ and $C_{B2}$ form a capacitor pair $C_2$, and associated capacitors $C_{An}$ and $C_{Bn}$ form a capacitor pair $C_n$.

Each pair of capacitors $C_n$ has an associated pair of transistors $M_n$. The associated pair of transistors $M_n$ is switched on or off by a pair of gate inputs $T_n$. Thus, each one-bit input $T_n$ of a multiple-bit coarse tuning value operates two transistors for each capacitor pair. In operation, assuming that coarse tuning value bits $T_1$ and $T_2$ are on and coarse tuning value bit $T_n$ is off, transistors $M_{A1}, M_{B1}, M_{A2}$, and $M_{B2}$ are turned on and transistors $M_{An}$ an $M_{Bn}$ are turned off. Consequently, capacitors $C_{A1}, C_{B1}, C_{A2}$, and $C_{B2}$ contribute to the effective capacitance of the LC tank while capacitors $C_{An}$ and $C_{Bn}$ do not.

Figure 5:
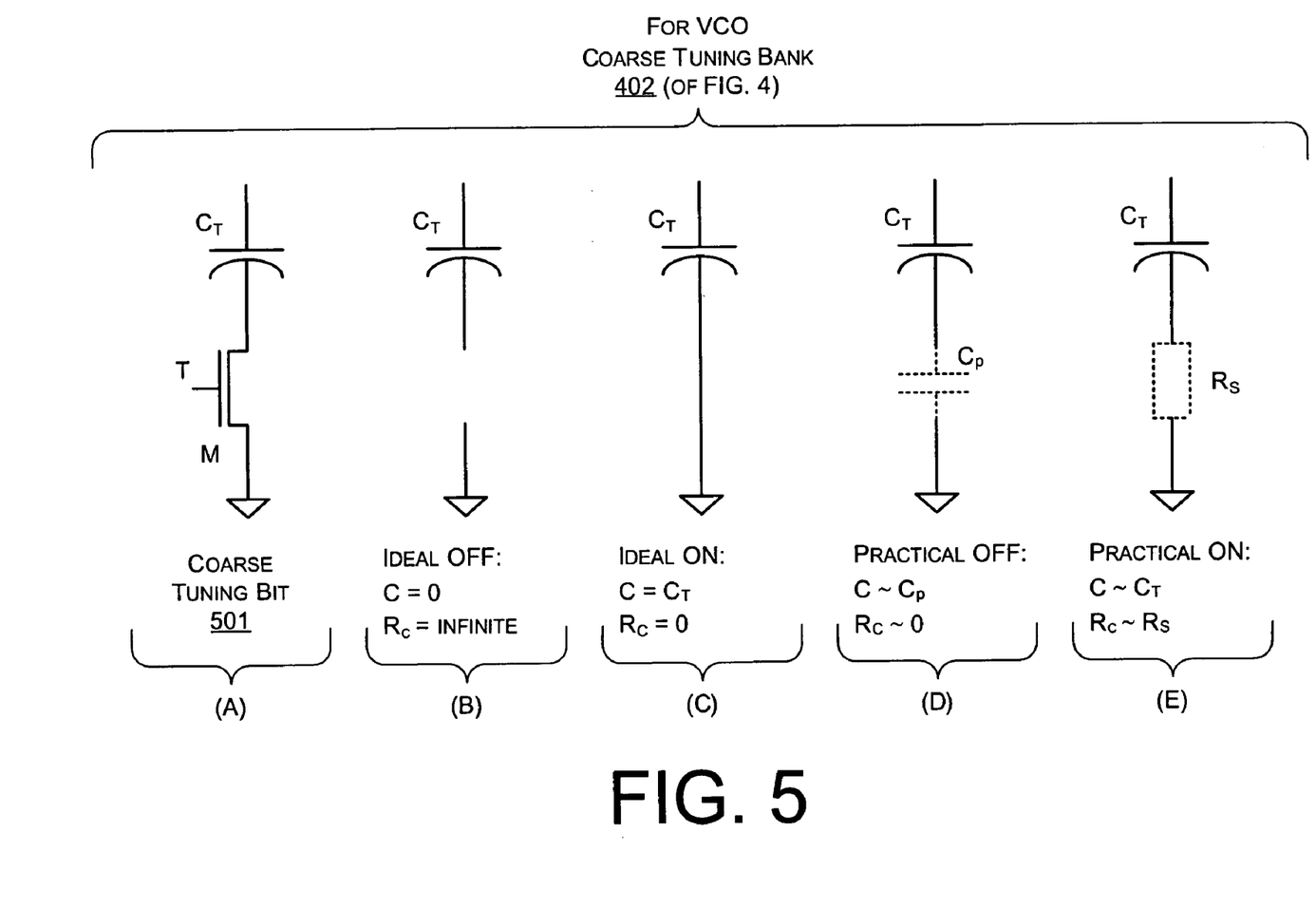
FIG. 5, which includes parts (A)-(E), illustrates example coarse tuning bit versions for the VCO coarse tuning bank of FIG. 4.

FIG. 5, which includes parts (A)-(E), illustrates example coarse tuning bit versions for the VCO coarse tuning bank 402 of FIG. 4. At FIG. 5(A), a coarse tuning bit 501 is shown. It includes a capacitor $C_T$, a transistor M, and a coarse tuning bit input T.

Coarse tuning bit 501 represents half of each pair of equivalent capacitors of the VCO coarse tuning bank 402. Each capacitor within a pair of capacitors is equivalent to the other in accordance with a desired level of precision and the process technology employed. By way of example only, equivalency may be defined as being between 1-10% of being equal.

Theoretically, the ratio of the effective bit capacitance in the ON state versus the OFF state in the coarse tuning capacitor banks can be infinite if an ideal switch is used. However, the use of MOS devices as integrated switches introduces additional capacitance and resistance in the LC tank of the VCO core 204 (FIG. 3). Parameters resulting from an ideal transistor switch are shown in FIGS. 5(B) and 5(C). Parameters resulting from a practical transistor switch are shown in FIGS. 5(D) and 5(E).

At FIG. 5(B), the OFF state of an ideal transistor is shown. The capacitance C equals zero (0), and the resistance $R_c$ is infinite. At FIG. 5(C), the ON state of an ideal transistor is shown. The capacitance C equals $C_T$, and the resistance $R_C$ equals zero (0).

At FIG. 5(D), the OFF state of a practical transistor is shown. The capacitance C is approximately $C_p$ (i.e., the parasitic capacitance of the turned-off real-world transistor), and the resistance $R_C$ is approximately zero (0). At FIG. 5(E), the ON state of a practical transistor is shown. The capacitance C is approximately $C_T$, and the resistance $R_C$ is approximately $R_S$ (i.e., the source/drain ON resistance of the turned-on practical transistor).

For a high performance VCO that is expected (i) to operate over a wide tuning range and (ii) to meet a low phase noise requirement, the practical transistor effects as shown in FIGS. 5(D) and 5(E) cannot be ignored. In practical VCO design, the parasitic capacitance (which originates mainly from the diffusion capacitance of the MOS switch) in the switch OFF state limits the tuning range of the VCO as it degrades the ON/OFF ratio of the tuning capacitance. The parasitic resistance of the MOS device in the switch ON state, on the other hand, degrades the Q-factor of the LC tank and therefore limits the phase noise performance of the VCO.

For a given VLSI technology, improving the tuning range involves using physically smaller MOS switch devices, which have a lower parasitic capacitance in the OFF state. Improving phase noise performance, on the other hand, involves using larger MOS switch devices, which have a lower parasitic resistance in the ON state. Thus, the two optimization options are diametrically opposed to each other. There are alternative approaches to optimization, such as using a better technology, a greater bias current, a higher charge-pump-to-gate-voltage ratio, multiple tanks, and so forth. However, these alternative approaches suffer from higher costs and/or higher power demands.

Figure 6:
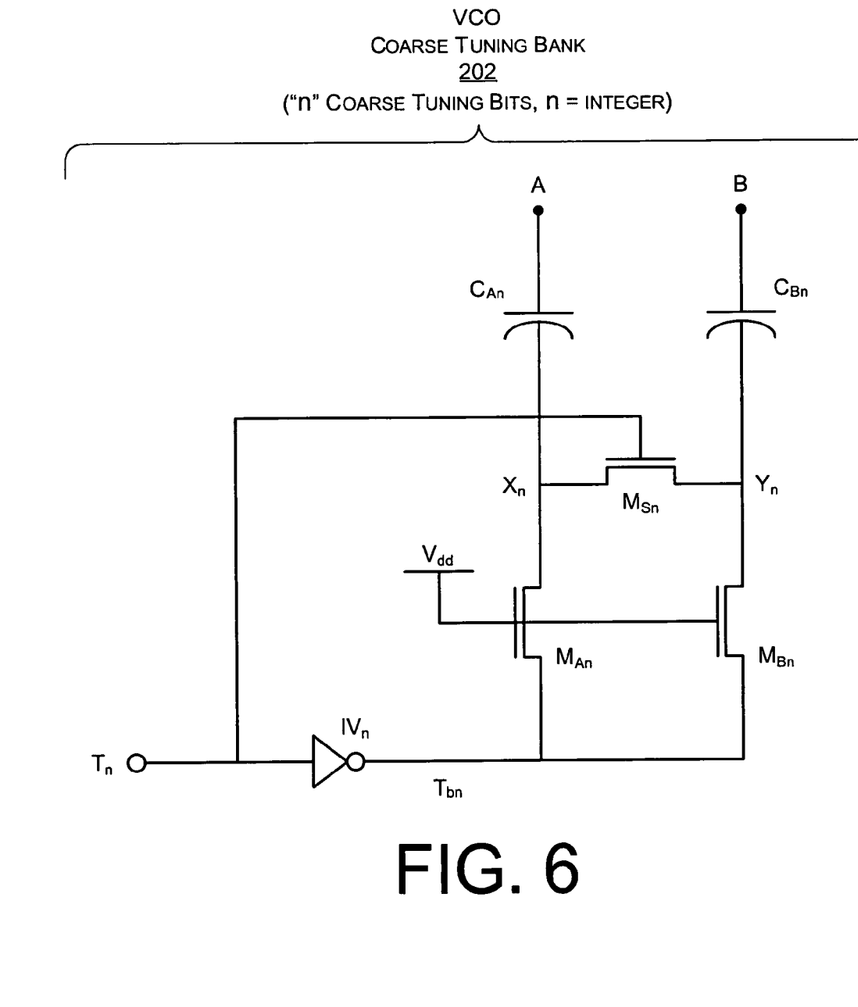
FIG. 6 is a circuit diagram of an example VCO coarse tuning bank that includes one switch transistor linking a pair of capacitors that are arranged in a differential relationship.

FIG. 6 is a circuit diagram of an example VCO coarse tuning bank 202 that includes one switch transistor $M_{Sn}$ linking a pair of capacitors $C_{An}$ and $C_{Bn}$ that are arranged in a differential relationship. The circuit diagram of FIG. 6 represents one coarse tuning bit for a described implementation. Multiple (e.g., "n") such coarse tuning bits form a VCO coarse tuning bank 202. Each of the multiple coarse tuning bits include a node A and a node B that couple to the differential nodes A and B of VCO core 204 (of FIG. 2 generally and of the specific example of FIG. 3).

As illustrated, the coarse tuning bit of VCO coarse tuning bank 202 includes two capacitors $C_{An}$ and $C_{Bn}$; three transistors $M_{Sn}$, $M_{An}$, and $M_{Bn}$; and one inverter $IV_n$. It also includes one coarse tuning input control node $T_n$, an inverted coarse tuning input control node $T_{bn}$, nodes $X_n$ and $Y_n$, and VCO coarse tuning bank coupling nodes A and B.

In a described implementation generally, the capacitor pair $C_n$ for the $n^{th}$ coarse tuning bit are grouped into a differential structure. Also, a single transistor switch $M_{Sn}$ is capable of activating both capacitor $C_{An}$ and $C_{Bn}$. In contrast, the VCO coarse tuning bank 402 (of FIG. 4) separates capacitor pairs $C_A$ and $C_B$ into two parts that are not structured differentially, and VCO coarse tuning bank 402 requires a pair of transistor switches $M_A$ and $M_B$ to activate a pair of capacitors $C_A$ and $C_B$. Thus, for each coarse tuning bit of VCO coarse tuning bank 202, one switching transistor is eliminated, two bias transistors $M_{An}$ and $M_{Bn}$ are added, and one inverter $IV_n$ is added.

Capacitors $C_{An}$ and $C_{Bn}$, along with bias transistors $M_{An}$ and $M_{Bn}$, are arranged in a differential relationship. Switching transistor $M_{Sn}$ is capable of shorting the two columns of the differential structure responsive to the coarse tuning input signal $T_n$. Capacitor $C_{An}$ is connected in series with transistor $M_{An}$, and capacitor $C_{Bn}$ is connected in series with transistor $M_{Bn}$. These two capacitor-transistor series circuits are coupled together in parallel to form the differential structure. The two bias transistors $M_{An}$ and $M_{Bn}$ may be small relative to switching transistor $M_{Sn}$. Transistors $M_{An}$ and $M_{Bn}$ have substantially equivalent component parameters and are included to set the operation points of the bottom nodes of the capacitors $C_{An}$ and $C_{Bn}$.

In a described implementation specifically, capacitor $C_{An}$ is coupled between node A and node $X_n$, and capacitor $C_{Bn}$ is coupled between node B and node $Y_n$. Bias transistor $M_{An}$ is coupled between node $X_n$ and node $T_{bn}$, and bias transistor $M_{Bn}$ is coupled between node $Y_n$ and node $T_{bn}$. Switching transistor $M_{Sn}$ is coupled between node $X_n$ and node $Y_n$. Coarse tuning bit input signal inverter $IV_n$ is coupled between node $T_n$ and node $T_{bn}$.

The standard or non-inverting input of inverter $IV_n$ is located at node $T_n$, and the inverting output of inverter $IV_n$ is located at node $T_{bn}$. The gates of bias transistors $M_{An}$ and $M_{Bn}$ receive the supply voltage $V_{dd}$. The gate of switching transistor $M_{Sn}$ receives the coarse tuning bit input signal $T_n$. With NMOS technology, for example, the drain terminals of transistors $M_{An}$ and $M_{Bn}$ are located at nodes $X_n$ and $Y_n$, respectively, and the source terminals of transistors $M_{An}$ and $M_{Bn}$ are located at node $T_{bn}$. Although other values may be used, example voltage values for $V_{dd}$ are 1.2V, 2.2V, 3V, and so forth.

The source and drain terminals of transistor $M_{Sn}$ may be located at either of nodes $X_n$ or $Y_n$. The gate terminal of transistor $M_{Sn}$ receives the coarse tuning bit input signal $T_n$. When the coarse tuning bit input signal $T_n$ is high, switch transistor $M_{Sn}$ is closed, so it effectively becomes a short.

The circuit of a coarse tuning bit of VCO coarse tuning bank 202 can create a differential Miller effect because of the opposite polarities of the voltages at nodes A and B (or nodes $X_n$ and $Y_n$). For example, given that node $X_n$ corresponds to the source terminal of transistor $M_{Sn}$, node $X_n$ can actually drop below ground during the half of the oscillation cycle when node A is lower than node B because of the charge storage on capacitors $C_{An}$ and $C_{Bn}$. Similarly, during the other half of the cycle, as node B is lower than node A, node $Y_n$ drops lower than the ground potential. This effect reflects that the ON resistance $R_s$ of the switching transistor $M_{Sn}$ between the differential terminals $X_n$ and $Y_n$ is smaller than in the scheme of FIGS. 4 and 5 for the same device size and therefore for the same parasitic capacitance. This effect indicates that for the same tuning range, a lower phase noise VCO can be constructed. This effect also indicates that if a smaller size for switching transistor $M_{Sn}$ is used to obtain the same $R_s$ as in the other tuning scheme of FIGS. 4 and 5, a lower parasitic capacitance can be achieved, which results in a wider frequency tuning range.

Figure 7:
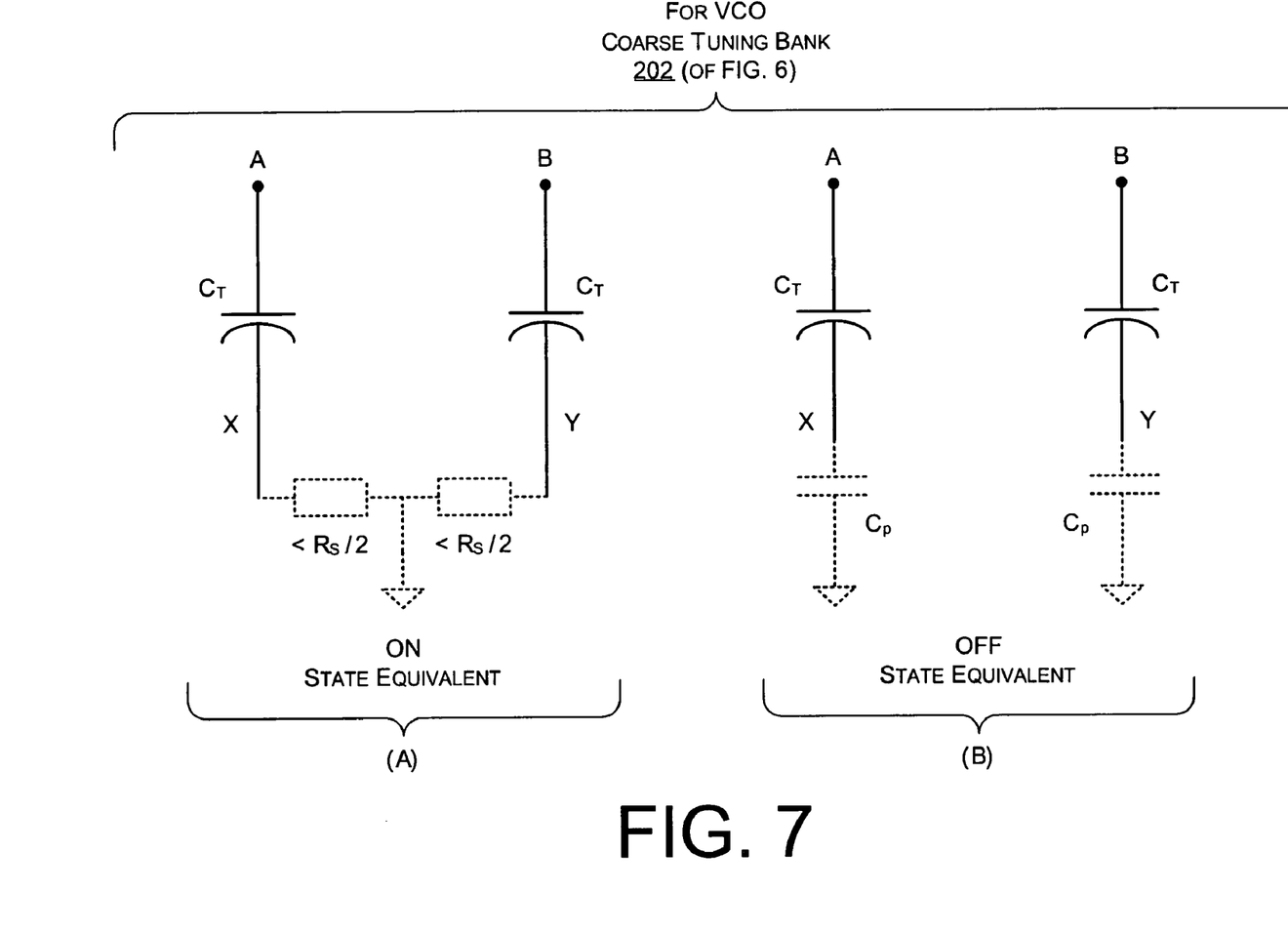
FIG. 7, which includes parts (A) and (B), illustrates example coarse tuning bit versions for the VCO coarse tuning bank of FIG. 6.

FIG. 7, which includes parts (A) and (B), illustrates example coarse tuning bit versions for the VCO coarse tuning bank 202 of FIG. 6. At FIG. 7(A), the ON state equivalent is shown. With switching transistor $M_{Sn}$ turned on, it effectively acts as a short. The effective ON resistance between node $X_n$ and $Y_n$ includes the source/drain resistance of $M_{Sn}$ (<$R_S$, with $R_S$ being the ON resistance of the same switch device as in the scheme shown in FIG. 4, due to the effect described in the paragraph above) in parallel with the ON resistance of the bias transistors $M_{An}$ and $M_{Bn}$. Consequently, the combined switch ON resistances is less than halved (<$R_S$/2). In other words, the single switching transistor scheme of FIG. 6 approximately cuts in half the parasitic resistance $R_S$ in the ON state.

At FIG. 7(B), the OFF state equivalent for a coarse tuning bit of VCO coarse tuning bank 202 is shown. The same parasitic capacitance $C_p$ affects each tuning capacitor $C_T$. In other words, a parasitic capacitance $C_p$ affects each differential side of the capacitance of the LC tank when the switching transistor $M_{Sn}$ is turned off.

More specifically, with reference to FIGS. 6 and 7, during the ON state of the switching transistor $M_{Sn}$, $M_{Sn}$ is in a linear mode. Because the channel resistance is across the two differential voltage nodes $X_n$ and $Y_n$, the effective series resistance in each tuning branch is reduced by half. Moreover, the node voltage of the source terminal of the transistor $M_{Sn}$ actually drops below ground, which provides an extra channel resistance reduction (i.e., it drops to <$R_S$/2). An additional effective series resistance reduction may also be contributed from the two pull-down MOS components $M_{An}$ and $M_{Bn}$. By way of example only, for a fairly typical 2.75V supply voltage and an approximately 0.7V threshold voltage of the NMOS transistor, the effective series resistance can be reduced to approximately as little as ⅓ of that of the approach of FIGS. 4 and 5.

During the OFF state of the switch, the switching transistor $M_{Sn}$ is off, and the source and drain parasitic capacitors contribute to the effective load capacitance as capacitors $C_p$. If the same component size is used as compared to the switching approach illustrated in FIGS. 4 and 5, the capacitive value of $C_p$ is similar in both cases. However, the pulling-up of the voltages at the nodes $X_n$ and $Y_n$ provides a further reduction to the parasitic capacitance of the switching component. Consequently, the single-switch approach of FIGS. 6 and 7 provides a greater tuning range even if the same switch size is used. Although the drain capacitance of $M_{An}$ and $M_{Bn}$ may introduce a slight capacitance penalty, by using relatively smaller transistor components (e.g., <½ to <1/20, such as <1/10) as compared to the main switch transistor $M_{Sn}$, the penalty can be ignored.

In short, implementations of the single-switch scheme of FIGS. 6 and 7 can reduce the effective series resistance in the ON state without significantly impacting the effective parasitic capacitance $C_p$ of the OFF state. Thus, implementations of the single-switch scheme can yield better phase noise for the same tuning range or greater tuning range without degrading the phase noise.

Figure 8:
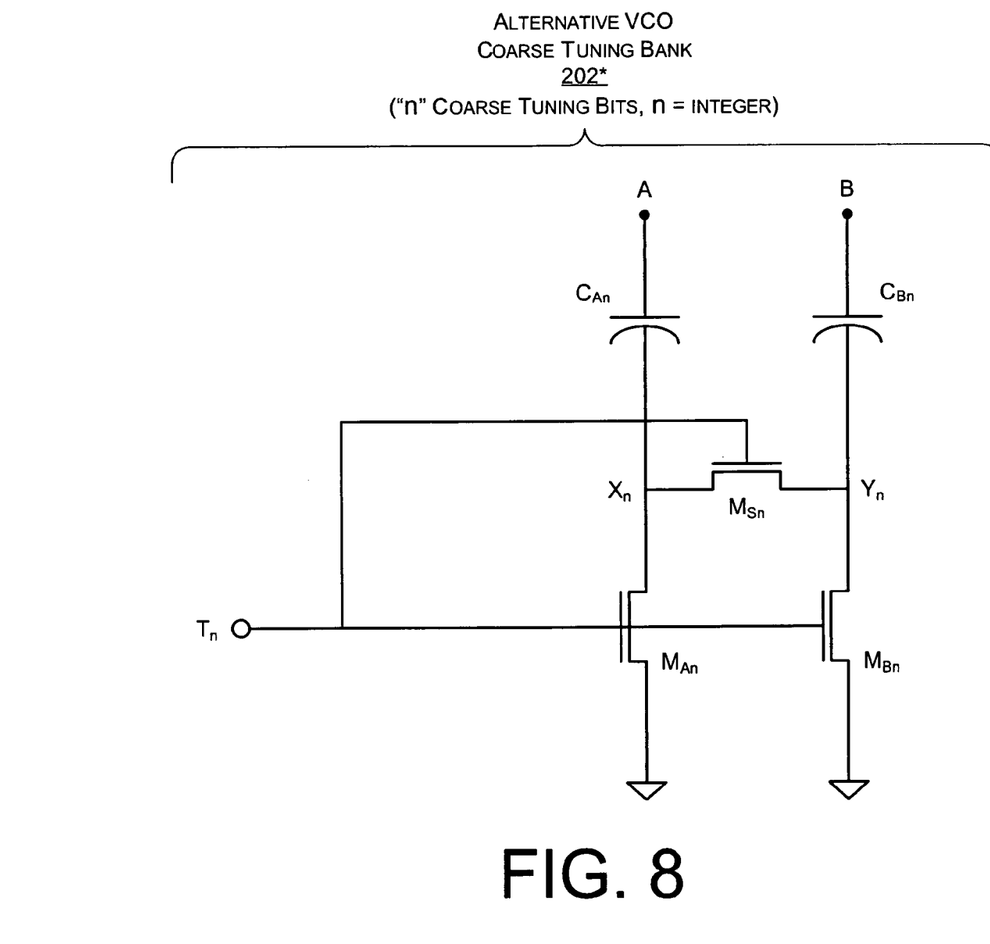
FIG. 8 is a circuit diagram of an alternative example to the VCO coarse tuning bank of FIG. 6.

FIG. 8 is a circuit diagram of an alternative example 202* to the VCO coarse tuning bank 202 of FIG. 6. Alternative coarse tuning bank 202* differs from coarse tuning bank 202 in that it omits the inverter $IV_n$. The coarse tuning bit input signal $T_n$ is still applied to the gate of switching transistor $M_{Sn}$.

Node $T_{bn}$, as the inverse of the coarse tuning bit input signal, is not present within alternative coarse tuning bank 202*. Instead, transistor $M_{An}$ and transistor $M_{Bn}$ are coupled between the nodes $X_n$ and $Y_n$, respectively, and the ground potential. Also, instead of being coupled to the supply voltage, the gates of transistors $M_{An}$ and $M_{Bn}$ receive the coarse tuning bit input signal $T_n$. Although including the inverter $IV_n$ is an alternative implementation, employing the inverter $IV_n$ as illustrated in FIG. 6 can improve performance because it lowers the parasitic capacitance $C_p$.

Figure 9:
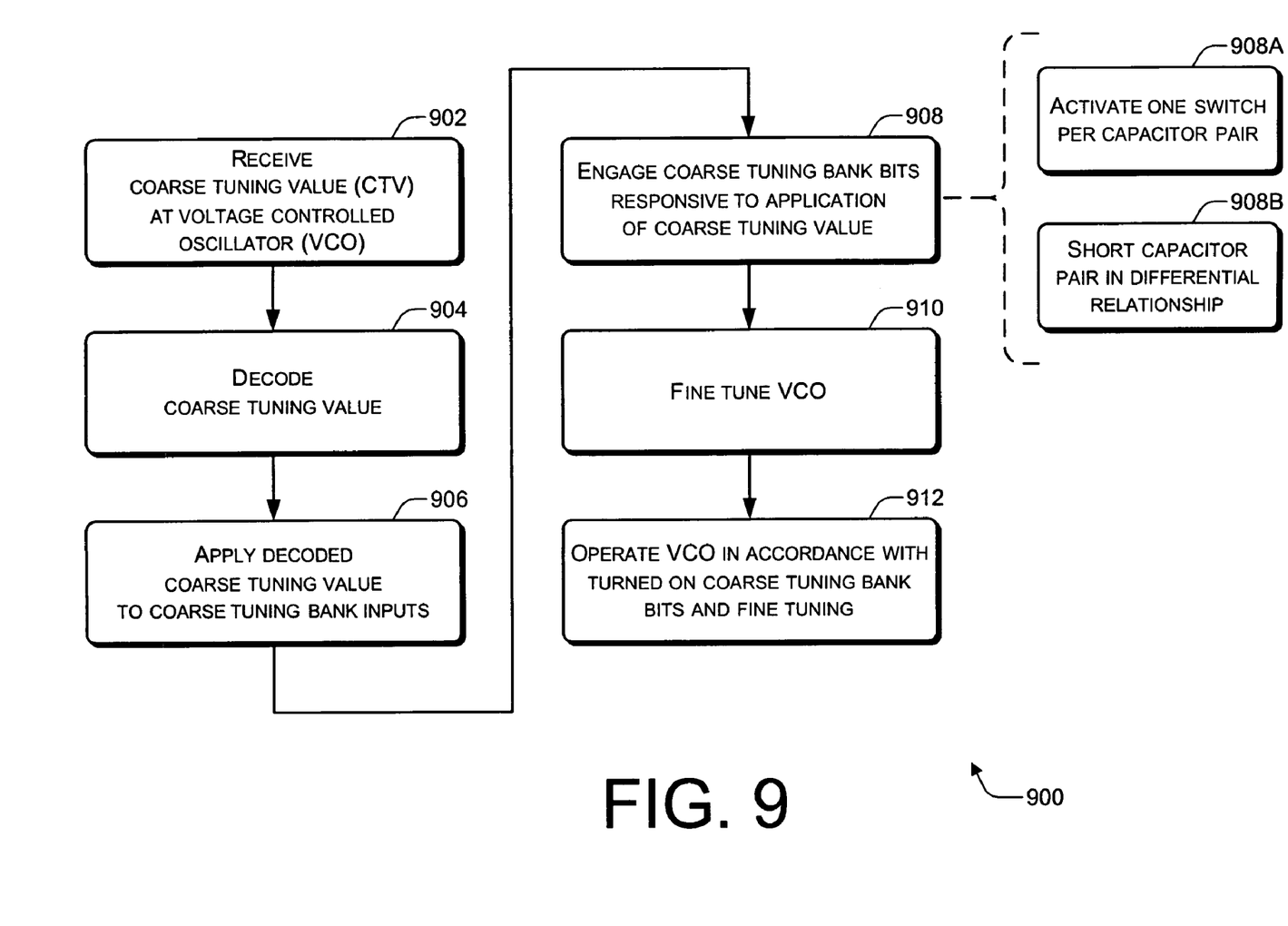
FIG. 9 is a flow diagram that illustrates an example method for operating a VCO that is configured in accordance with FIG. 6 or FIG. 8.

FIG. 9 is a flow diagram 900 that illustrates an example method for operating a VCO that is configured in accordance with FIG. 6 or FIG. 8. Flow diagram 900 includes six (6) "primary" blocks 902-912 and two (2) "secondary" blocks 908A and 908B. Although the actions of flow diagram 900 may be performed in other environments and with a variety of circuitry implementations, FIGS. 1-3 and 6-8 are used in particular to illustrate certain aspects and examples of the method. By way of example only, the actions of flow diagram 900 may be performed by a VCO 104 having a VCO coarse tuning bank 202/202*.

At block 902, a coarse tuning value (CTV) is received at a voltage controlled oscillator (VCO). For example, an 8, 16, or 32-bit CTV may be received at VCO 104. At block 904, the coarse tuning value is decoded. For example, a decoder (not explicitly shown) of VCO 104 may decode the CTV. At block 906, the decoded coarse tuning value is applied to inputs of a coarse tuning bank of the VCO. For example, the decoded CTV may be applied to multiple coarse tuning inputs T of a VCO coarse tuning bank 202.

At block 908, coarse tuning bank bits are engaged responsive to application of the coarse tuning value. For example, one or more respective switching transistors may be activated so as to enable their respective coarse tuning capacitors to contribute to the capacitive part of the LC tank of VCO 104.

The action(s) of block 908 may further include the action(s) of block 908A and/or block 908B. At block 908A, one switch is activated per capacitor pair. For example, a single switching transistor $M_{Sn}$ may be turned on so as to create a differential Miller effect with respect to a pair of coarse tuning capacitors $C_{An}$ and $C_{Bn}$. At block 908B, capacitors of a capacitor pair that is arranged in a differential relationship are shorted together so as to create a common node between them. For example, a pair of coarse tuning capacitors $C_{An}$ and $C_{Bn}$ may be shorted together so as to create a common node between them with the common node being coupled to two bias transistors $M_{An}$ and $M_{Bn}$.

At block 910, the VCO is fine tuned. For example, VCO core 204 may be fine tuned using a fine tuning input $V_T$ and two diodes $D_A$ and $D_B$. At block 912, the VCO is operated in accordance with coarse tuning (e.g., coarse tuning bank bits that are turned on) and fine tuning. For example, VCO 104 may be operated in accordance with those coarse tuning bank bits of VCO coarse tuning bank 202 that are turned on and in accordance with the fine tuning of VCO core 204.

VCO tuning, as described herein, may be implemented in numerous environments. Example environments are described above, especially in conjunction with the description of FIG. 1. One example environment is the wireless environment. Suitable wireless environments include, by way of example but not limitation, Wireless Local Area Network (WLAN), Wireless Wide Area Network (WWAN), Worldwide Interoperability for Microwave Access (WiMax), Wireless Personal Area Network (WPAN), Wireless Metropolitan Area Network (WMAN), Code Division Multiple Access (CDMA) cellular radiotelephone communication systems, Global System for Mobile Communications (GSM) cellular radiotelephone systems, North American Digital Cellular (NADC) cellular radiotelephone systems, Time Division Multiple Access (TDMA) systems, Extended-TDMA (E-TDMA) cellular radiotelephone systems, third generation (3G) systems like Wide-band CDMA (WCDMA), CDMA-2000, Universal Mobile Telecommunications System (UMTS), and so forth.

By way of example only, a VCO may be designed to cover a frequency range from 3476 Mhz to 3980 Mhz for GSM and from 3680 Mhz to 4340 M for WCDMA while maintaining a low phase noise. (In practice, an extra tuning range (+5~8% extra) is usually provided to ensure manufacturability of the product under various PVT variations.) Furthermore, VCOs for wireless applications may be expected to offer phase noise of better than −120 dBc at 600 kHz offset and about −135 dBc at 3 Mhz offset.

Additional example environments involve a wireless link that is implemented in accordance with the Bluetooth short range wireless protocol (Specification of the Bluetooth System, Version 1.2, Bluetooth SIG, Inc., November 2003, and related specifications and protocols), IEEE 802.11 (ANSI/IEEE Std 802.11-1999 Edition and related standards), IEEE 802.16 (ANSI/IEEE Std 802.16-2002, IEEE Std 802.16a, March, 2003 and related standards), HIPERLAN 1, 2 and related standards developed by the European Telecommunications Standards Institute (ETSI) Broadband Radio Access Networks (BRAN), HomeRF (HomeRF Specification, Revision 2.01, The HomeRF Technical Committee, July, 2002 and related specifications), and so forth.

Although the description above uses language, and the associated figures use blocks and other diagrammatic representations, that are specific to structural features and/or methodological acts, it is to be understood that the appended claims are not limited to the specific features or acts described. Rather, the specific features and acts are disclosed as example forms of implementing the VCO tuning described herein.

The invention claimed is:

1. A device comprising:
a voltage controlled oscillator (VCO) having an inductive-capacitive (LC) tank, the VCO capable of activating and deactivating respective capacitor pairs of the LC tank with respective single switching transistors;
wherein the VCO includes at least one VCO coarse tuning bank bit for a course tuning bank, the VCO coarse tuning bank bit comprising:
a pair of capacitors including a first capacitor and a second capacitor; the first capacitor coupled to a first node, and the second capacitor coupled to a second node;
a pair of bias transistors including a first bias transistor and a second bias transistor; the first bias transistor coupled between the first node and a third node, the second bias transistor coupled between the second node and the third node;
a switching transistor coupled between the first node and the second node, the switching transistor including a gate terminal that receives a coarse tuning bank bit input signal; and
an inverter that receives the coarse tuning bank bit input signal and produces an inverse coarse tuning bank bit input signal, the inverter to provide the inverse coarse tuning bank bit input signal to the third node.

2. The device as recited in claim 1, wherein the VCO is adapted to generate a frequency responsive to the activated and deactivated capacitor pairs of the LC tank.

3. The device as recited in claim 2, further comprising:
a transceiver that is adapted to accept the frequency from the VCO;
wherein the device comprises a mobile phone.

4. The device as recited in claim 2, further comprising:
a central processing unit (CPU) that is adapted to accept the frequency from the VCO;
wherein the device comprises a computer.

5. The device as recited in claim 1, wherein the coarse tuning bank includes multiple coarse tuning bit inputs that enable (i) collective activation and deactivation of the capacitor pairs and (ii) a coarse tuning of a frequency generated by the VCO.

6. The device as recited in claim 5, wherein the VCO comprises a VCO core that includes a fine tuning input, the fine tuning input enabling a fine tuning of the frequency generated by the VCO.

7. The device as recited in claim 1, wherein a parasitic capacitance of the pair of bias transistors can be reduced by providing the inverse coarse tuning bank bit input signal to the third node.

8. An integrated circuit (IC) comprising:
a voltage controlled oscillator (VCO) core having a first coarse tuning bank node and a second coarse tuning bank node, the VCO core including a core capacitance; and
a VCO coarse tuning bank that interfaces with the VCO core at the first coarse tuning bank node and the second coarse tuning bank node; the VCO coarse tuning bank including multiple coarse tuning bank bits, each coarse tuning bank bit comprising a pair of capacitors that are arranged in a differential structure, each pair of capacitors having a bit capacitance that is capable of being selectively engaged so as to contribute the bit capacitance to the core capacitance of the VCO core;
wherein each coarse tuning bank bit comprises a switching transistor that is capable of creating a common node between each pair of capacitors when the switching transistor is activated;
wherein the differential structure of each coarse tuning bank bit includes a pair of bias transistors, each respective bias transistor of the pair of bias transistors connected in series with a respective capacitor of the pair of capacitors; and
wherein each coarse tuning bank bit further comprises an inverter, the inverter to accept a coarse tuning bank bit signal input and to produce an inverted coarse tuning bank bit signal at a node to which the pair of bias transistors is coupled.

9. The IC as recited in claim 8, wherein a first capacitor of each pair of capacitors is coupled to the first coarse tuning bank node, and a second capacitor of each pair of capacitors is coupled to the second coarse tuning bank node.

10. The IC as recited in claim 8, wherein the VCO core and the VCO coarse tuning bank comprise a VCO having a total VCO capacitance, the total VCO capacitance established by the core capacitance and the bit capacitances of the multiple coarse tuning bank bits that have been selectively engaged.

11. A system comprising:
a signal source; and
a circuit comprising:
a first capacitor coupled to a first node;
a second capacitor coupled to a second node;
a first bias transistor coupled to the first node;
a second bias transistor coupled to the second node; and
a switching transistor coupled between the first node and the second node, the switching transistor including a gate terminal that receives a coarse tuning bank bit input signal at a third node;
wherein the first bias transistor is coupled between the first node and a fourth node, and the second bias transistor is coupled between the second node and the fourth node; and wherein the circuit further comprises:
an inverter coupled between the third node and the fourth node; an input of the inverter corresponding to the third node, and an inverting output of the inverter corresponding to the fourth node.

12. The system as recited in claim 11, wherein the first bias transistor includes a first gate terminal, and the second bias transistor includes a second gate terminal; and wherein the first gate terminal and the second gate terminal are connected to a supply voltage.

13. The system as recited in claim 11, wherein the switching transistor comprises an N-channel metal oxide semiconductor (NMOS) transistor.

14. The system as recited in claim 11, wherein a voltage at the first node drops below ground during operation of the circuit.

15. The system as recited in claim 11, wherein the switching transistor shorts the first node and the second node when the switching transistor is activated by the coarse tuning bank bit input signal.

16. The system as recited in claim 11, further comprising:
a voltage controlled oscillator (VCO) core having fifth node and a sixth node;
wherein the first capacitor is coupled between the first node and the fifth node, and the second capacitor is coupled between the second node and the sixth node.

17. The system as recited in claim 16, wherein activation of the switching transistor by the coarse tuning bank bit input signal causes the first capacitor and the second capacitor to be engaged and to contribute a first capacitance and a second capacitance, respectively, to a core capacitance of the VCO core.

18. A method comprising:
applying a coarse tuning value to multiple coarse tuning bank inputs of multiple coarse tuning bank bits;
inverting the coarse tuning value to produce an inverse coarse tuning value;
selectively engaging coarse tuning bank bits of the multiple coarse tuning bank bits by selectively activating a single switch per capacitor pair of each coarse tuning bank bit responsive to the applied coarse tuning value; each respective coarse tuning bank bit including a respective bias transistor pair that is coupled to a respective capacitor pair, each bias transistor pair capable of producing a parasitic capacitance; and
applying the inverse coarse tuning value to each bias transistor pair so as to reduce the parasitic capacitance.

19. The method as recited in claim 18, further comprising:
fine tuning a voltage controlled oscillator (VCO); and
operating the VCO in accordance with the fine tuning and the selectively engaged coarse tuning bank bits.

20. The method as recited in claim 19, wherein the selectively engaging comprises:
causing capacitance of the capacitor pair to be contributed to an overall capacitance of the VCO for each coarse tuning bank bit that is engaged.

21. The method as recited in claim 18, wherein the selectively engaging comprises:
shorting the capacitor pair, of which capacitors thereof are arranged in a differential relationship, for each coarse tuning bank bit that is engaged.

22. The method as recited in claim 21, wherein the shorting comprises:
initiating a Miller effect with respect to at least one capacitor of the capacitor pair for each coarse tuning bank bit that is engaged.

* * * * *